United States Patent [19]
Lee et al.

[11] Patent Number: 5,734,301
[45] Date of Patent: Mar. 31, 1998

[54] DUAL PHASE-LOCKED LOOP CLOCK SYNTHESIZER

[75] Inventors: Chao-Cheng Lee, Chungli; Chen-Chih Huang, Hsinchu Hsien, both of Taiwan

[73] Assignee: Realtek Semiconductor Corporation, Taipei, Taiwan

[21] Appl. No.: 698,308

[22] Filed: Aug. 15, 1996

[51] Int. Cl.$^6$ .................................. H03L 7/07; H03L 7/089
[52] U.S. Cl. .................................. 331/2; 331/1 A; 331/17; 331/25; 331/34; 327/148; 327/150; 375/374; 375/376
[58] Field of Search .................................. 331/1 A, 2, 8, 331/17, 25, 34, 57; 327/147–150, 156–159; 360/41, 51; 375/374–376

[56] References Cited

U.S. PATENT DOCUMENTS 5,546,052  8/1996  Austin et al. .................................. 331/25 X

OTHER PUBLICATIONS

"A 200 MH$_z$ CMOS Phase–Locked Loop with Dual Phase Detectors", *IEEE Journal of Solid–State Circuits*, vol. 24, No. 6, Dec. 1989, Ware K.M. et al, pp. 1560–1568.

*Primary Examiner*—David Mis
*Attorney, Agent, or Firm*—Michael D. Bednarek; Kilpatrick Stockton LLP

[57] ABSTRACT

A dual phase-locked loop (PLL) clock synthesizer is disclosed for generating clock signal in synchronization with the data input signal received over a network environment. The dual PLL clock synthesizer is suitable for processing data streams of any bit sequence without data error caused by interference due to clock signal jittering phenomena. The dual PLL clock synthesizer is particularly suitable for application to high-speed Ethernet network environment such as for decoding to obtain the original data conveyed over the network through selected encoding scheme.

6 Claims, 7 Drawing Sheets

DUAL PHASE-LOCKED LOOP CLOCK SYNTHESIZER

BACKGROUND OF THE INVENTION

1. Field of the Invention

The present invention relates in general to a clock synthesizer for synchronizing network data signals. In particular, the present invention relates to a dual phase-locked loop clock synthesizer for synchronizing network data signals encoded in the NRZI scheme.

2. Technical Background

In Ethernet networks operating at a clock frequency range of 10 MHz, information is usually encoded into Manchester code and transmitted. FIG. 8A depicts the Manchester encoding for the two basic binary data bits "1" and "0." As shown in FIG. 8A, the logical 1 data is represented by a signal rising from low voltage to high voltage, and the logical 0 by one falling from high voltage to low voltage. Either logic 1 or logic 0 has period 100 nS wherein each of low period and high period is 50 nS. FIG. 8B gives an example of an eight-bit data stream "11100110" represented by the Manchester code. Note that in the Manchester encoding scheme, low voltage or high voltage can only have period of 50 nS or 100 nS. For implementing the Manchester encoding, conventional single phase-locked loop (PLL) circuitry as shown in FIG. 9 can be used to reconstruct the original data sequence which is synchronized based on the received data signal (Manchester code). The conventional clock synthesizer as shown in FIG. 9 includes a phase frequency detector 1, a charge pump and loop filter 2, and a voltage-controlled oscillator (VCO) 3.

Due to the advancement as well as increase in the installed base of computer networks, network data transmit rate in hardware environment has been increased. For example, high-speed Ethernet networking systems transmitting data at 125 MHz clock rate has been developed employing the NRZI encoding scheme. FIG. 8C depicts such encoding scheme, specifically, while the received data is "1", the encoded data is transitioned, while the received data is "0", the encoded data keeps unchanged. As shown in FIG. 8C, given a data sequence of "01011100101100" and an initial state "0", the corresponding NRZI code is as shown in the lower part of FIG. 8C.

As is known in the art, consecutive 0 or 1 signal level may have an arbitrary bit length in the NRZI encoding scheme. For practical applications in high-speed Ethernet network environments, although signals are scrambled before they are encoded, consecutive "0" or "1" having length up to 60 bits may still exist. For data sequences containing such long periods of "0" or "1", the conventional single-PLL circuitry shown in FIG. 9 no longer can be utilized to generate clock signals according to received data signals. Assume that a data sequence data containing unchanged signal state with very long period is given to the input end of the single-PLL shown in FIG. 9, undesirable clock signals CK in which clock jitters exist are generated since the frequencies of such clock signals are adjusted continuously. Accumulation of such clock jitters inevitably lead to bit errors.

SUMMARY OF THE INVENTION

It is therefore an object of the present invention to provide a dual PLL clock synthesizer for generating clock signals in synchronization with the received data signal. The clock synthesizer in accordance with the invention includes a master PLL and a slave PLL, wherein the master PLL is used to coarsely determine the frequency of the clock signal and the slave PLL to finely tune the frequency in addition such that the generated clock signals are in synchronization with the received data signal.

BRIEF DESCRIPTION OF THE DRAWING

The invention and objects and features thereof will be more readily apparent from the following detailed description of preferred embodiments. The description is made with reference to the accompanied drawings in which.

DETAILED DESCRIPTION OF THE PREFERRED EMBODIMENT

The dual PLL clock synthesizer of the invention is utilized for generating clock signals synchronized with the NRZI encoded data signal.

Figure 1:
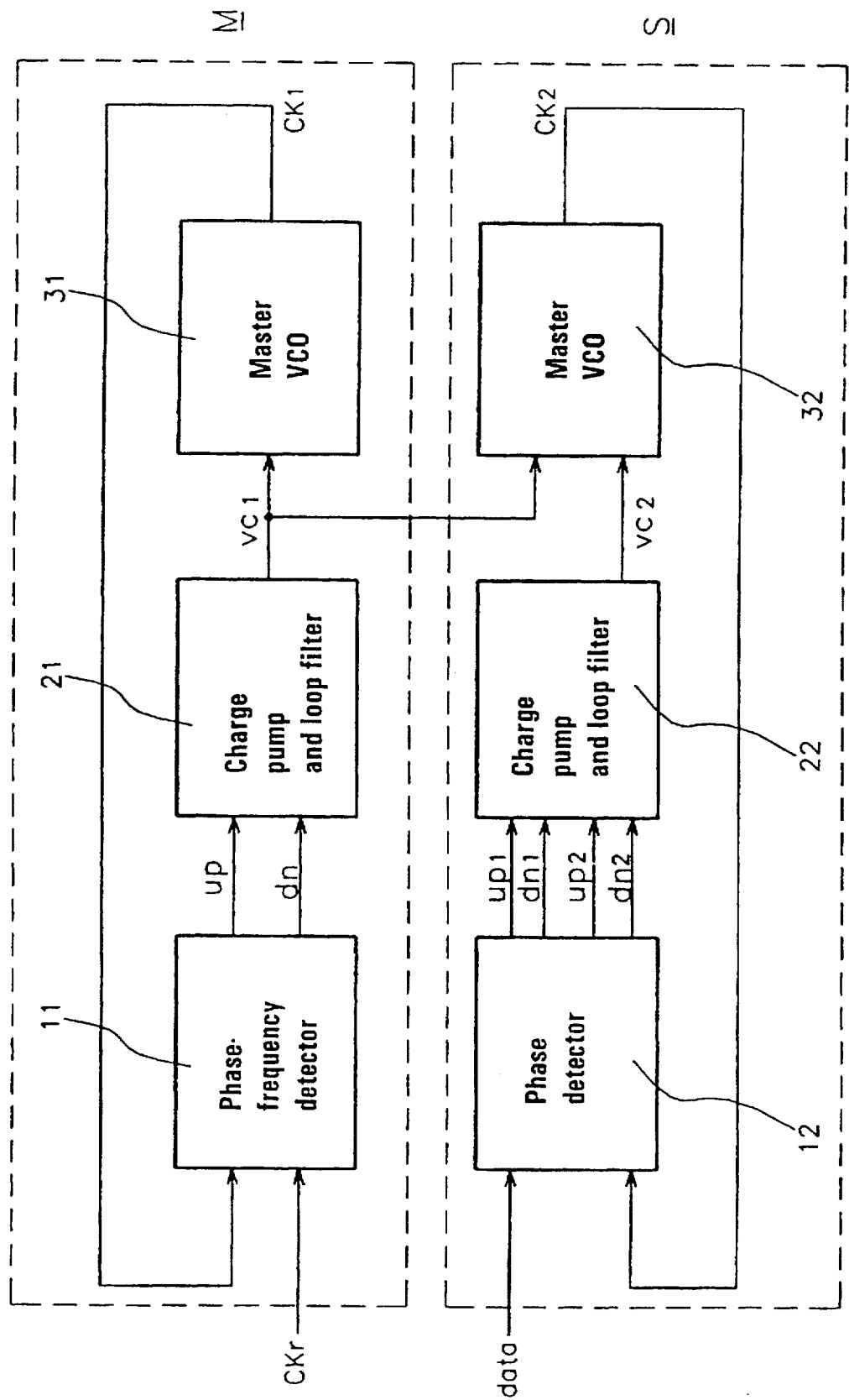
FIG. 1 is a block diagram showing the clock synthesizer synchronized with the received data signal in accordance with the present invention.

Referring to FIG. 1, the clock synthesizer which generates clock signals synchronized with the input data signal in accordance with the invention includes a master PLL M and a slave PLL S. The master PLL M includes a phase-frequency detector 11, a charge pump and loop filter 21, and a master VCO 31. The phase-frequency detector 11 receives the reference clock signal CKr from an external source and the feedback signal CK1 of the master PLL M. According to the relative phase difference between the two input signals CKr and CK1, the phase frequency detector 11 generates a pair of output signals up and tin by which the phase of the output signal CK1 of the master PLL M can be adjusted such that the signal CK1 has identical phase and frequency as that of the reference signal CKr. The charge pump and loop filter 21 receives the pair of control input signals up and dn and generates an output signal VC1. The master VCO 31 receives the VC1 signal and generates a clock signal CK1 having a frequency $f1$ equal to w1×|VC1|. Here w1 is a proportional constant signifying the fact that the frequency $f1$ is in proportional to the input voltage VC1. The clock signal CK1 is the feedback signal of the master PLL and used as a input signal of the phase-frequency detector 11. The master PLL is to generate a clock signal CK1 which has substantially the same phase and frequency as those of the reference clock signal CKr.

On the other hand, the slave PLL S includes a phase detector 12, a charge pump and loop filter 22, and a slave VCO 32. As is obvious from the drawing, the connection of the three components in the slave PLL S is similar to that of the master PLL M.

The phase detector 12 receives the data signal data from an external source, as well as the feedback signal CK2 of the slave PLL S itself. According to the two input signals data and CK2, the phase detector 12 generates two pairs of output signals up1, dn1 and up2, dn2. These two pairs of control signals are used to adjust the phase of the output signal CK2 of the slave PLL S while data changes from "1" to "0" or "0" to "1" such that the output signal CK2 is synchronized with the data signal data. The charge pump and loop filter 22 receives the control input signals up1, dn1 and up2, dn2 and generates an output signal VC2. The slave VCO 32 receives the VC2 signal as its controlling input voltage signal for generating an oscillating signal CK2.

Note that the slave VCO 32 receives VC2 as well as VC1. The signal VC1 constitutes an additional controlling parameter for the slave VCO 32 for generating the output clock signal CK2. As a result, the signal CK2 generated by the VCO 32 has an oscillating frequency $f2$ equal to (w2×|VC1|+w3×|VC2|), wherein w2>>w3. Here, again, the parameters w2 and w3 represent two proportional constants. Furthermore, master and slave VCO's 31 and 32 are arranged to have basically the same circuitry configuration. This results in the fact that the frequency of the slave VCO 32 is very close to that of the master VCO 31. Essentially, the output of the charge pump and loop filter 22, VC2, which is dependent on the two pairs of its input signals up1, dn1 and up2, dn2, is used to give a fine tuning of the frequency of the slave VCO 32. The combined effect of the dual phase-locked loop clock synthesizer is to generate the clock signal CK2 which not only has oscillating approximates that of the reference clock signal Ckr, but also is synchronized with the data signal data.

A preferred embodiment of the phase-frequency detector 11 of the master PLL M operates in the following manner. When it is decided that the reference clock signal input CKr has a phase leading the feedback clock signal CK1, the detector 11 generates the pair of output signals as up=1 and dn=0. The pair of output signals in this case subsequently make the charge pump and loop filter 21 increase its charge pumping, so that it will in mm control the master VCO 31 to advance the phase of its output oscillating signal. In another occasion, when it is decided that the reference clock input CKr has a phase equal to that of the feedback clock signal CK1, it generates the pair of output signals as up=0 and dn=0. In this case, the pair of output signals do not alter the phase of the oscillating signal CK1 output by the master VCO 31. In still another occasion, when it is decided that the reference clock signal input CKr has a phase lagging the feedback clock signal CK1, the detector 11 generates the pair of output signals as up=0 and dn=1. The pair of output signals in this case make the charge pump and loop filter 21 decrease its charge pumping, so that it will in turn control the master VCO 31 to postpone the phase of its output clock signal.

Figure 2:
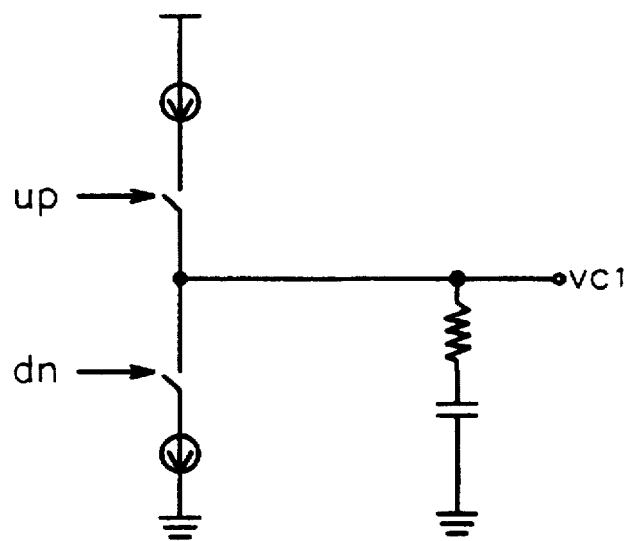
FIG. 2 is a schematic diagram showing a preferred embodiment of the charge pump and loop filter of the master PLL for the synthesizer in accordance with the present invention.

A preferred embodiment of the charge pump and loop filter 21 of the master PLL M is depicted in FIG. 2. When the phase-frequency detector 11 at the previous stage issues the pair of output signals as up=1 and dn=0, the charge pump and loop filter 21 increase the voltage of its output signal VC1. This can be done by enabling the up switch of the charge pump and loop filter 21 such that the capacitor will be charged up. On the other hand, when the pair of signals received is up=0 and dn=1, the charge pump and loop filter 21 decreases the voltage of its output signal VC1 by enabling the dn switch such that the capacitor will be discharged. Thus, in still another situation when the pair of input signals is up=0 and dn=0, the voltage at node VC1 will be kept unchanged as both the up and dn switches of the charge pump and loop filter 21 are open-circuited.

Figure 3:
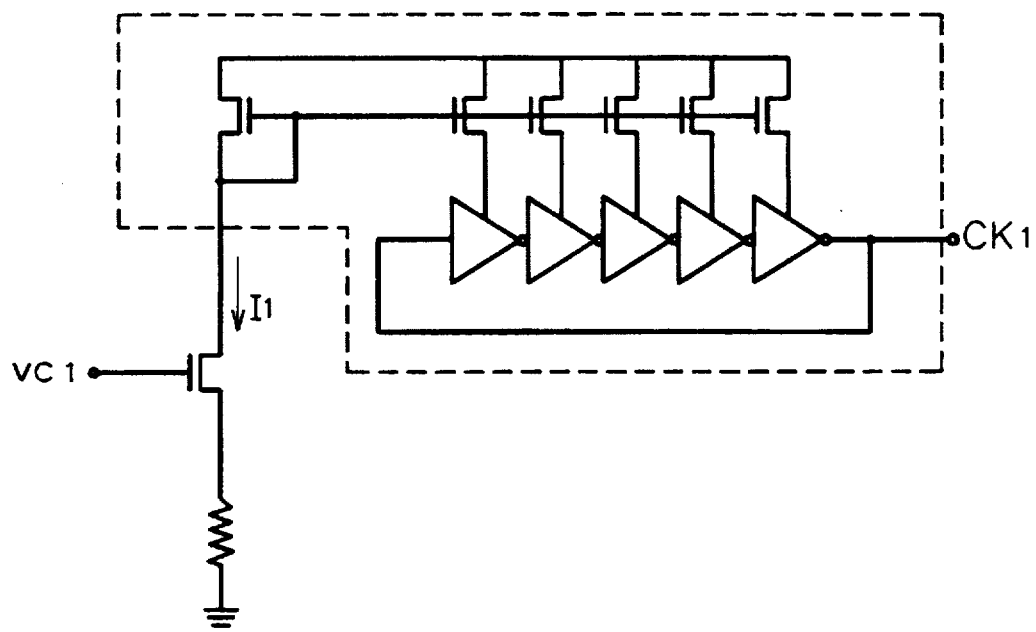
FIG. 3 is a schematic diagram showing a preferred embodiment of the master VCO of the master PLL for the synthesizer in accordance with the present invention.

A preferred embodiment of the master VCO 31 of the master PLL M is depicted in FIG. 3. The circuit portion identified by the phantom line block in FIG. 3 is a ring oscillator which outputs the clock signal CK1 having oscillating frequency $f1$ in proportion to the current I1 flowing into the MOS transistor. While the input current I1 is also in proportion to the voltage VC1 applied to the gate of the transistor, therefore the frequency $f1$ is in proportion to the voltage VC1.

Accordingly, the output oscillating signals CK1 generated by the master PLL M will be adjusted to become an oscillating signals having the same phase and frequency as that of the reference signal Ckr by the pair of internal control signals up and dn.

Figure 4:
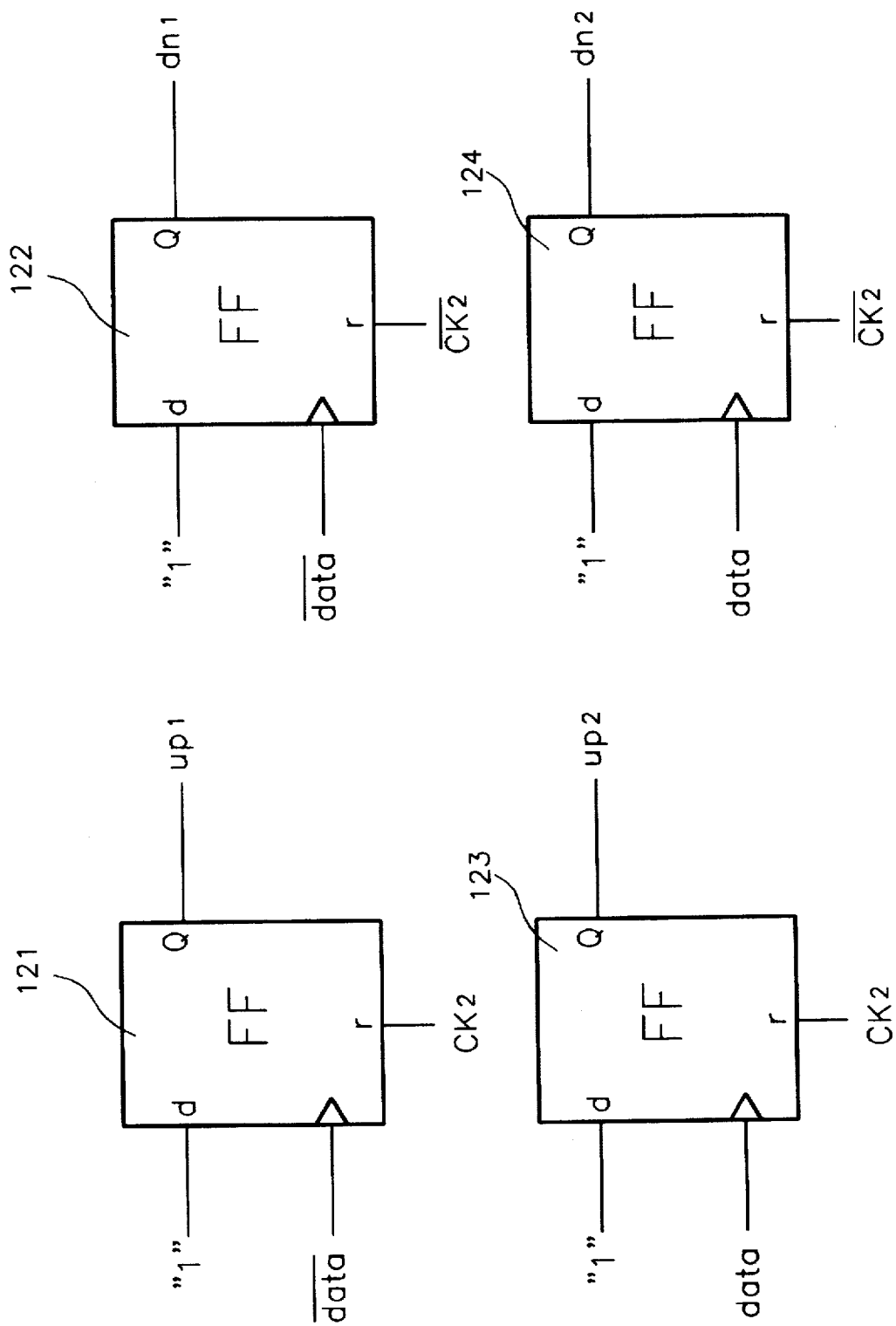
FIG. 4 depicts the four flip-flops constituting the phase detector of the slave PLL for the synthesizer in accordance with the present invention.

The operations of the slave PLL S is analyzed as follows. Similar to the phase-frequency detector 11, the phase detector 12 is to generate control signals which are used to adjust the output signal CK2 of the slave PLL S such that the output signal CK2 is synchronized with the external input data signal data. Referring to FIG. 4, a preferred embodiment of the phase detector 12 is depicted in FIG. 4 in which four independent rising edge-triggered D-type flip-flops 121, 122, 123 and 124 are included. The flip-flop 121 is employed to generate the up1 control signal at its Q output by tying a constant logical 1 or the complement ($\overline{CK2}$) of the oscillator output of the slave PLL S input to its D input, and have its reset input R controlled by the oscillator output CK2 of the slave PLL S, and its CLK input driven by the complement $\overline{data}$ of the external input data signal data. In a similar manner, the flip-flop 122 is employed to generate the dn1 control signal at its Q output by tying a constant logical 1 or the oscillator output CK2 of the slave PLL S input to its D input, its reset input R controlled by the complement $\overline{CK2}$ of the oscillating signal CK2, and its CLK input driven by the complement $\overline{data}$ of the external input data signal data.

Control signals up1 and dn1 can be used to adjust the phase of the CK2 oscillating signal, which is output by the slave VCO 32 and fed back to the phase detector 12 itself, at the falling edge of the data signal (i.e., rising edge of the $\overline{data}$ signal). The adjustment will allow the generated CK2 oscillating signal to be in-phase with the input data signal. Specifically, when CK2=0, the control signal pair will have a status of up1=1 and dn1=0. This advances the phase of the CK2 signal. On the other hand, when CK2=1, the control signal pair will have the status of up1=0 and dn1=1. This results in the push back of the phase of the CK2 signal.

Further, the flip-flop 123 is employed to generate the up2 control signal at its Q output by tying a constant logical 1 or the complement $\overline{CK2}$ of the oscillator output of the slave PLL S input to its D input, its reset input R controlled by the oscillating signal CK2, and its CLK input driven by the external input data signal data. And, the flip-flop 124 is employed to generate the dn2 control signal at its Q output by tying a constant logical 1 or the oscillator output CK2 of the slave PLL S input to its D input, its reset input R controlled by the inverted version $\overline{CK2}$ of the oscillating signal CK2, and its CLK input driven by the external input data signal data.

Control signals up2 and dn2, on the other hand, are also used to adjust the phase of the CK2 oscillating signal, which is generated by the slave VCO 32 and fed back to the phase detector 12 itself, at the rising edge of the data signal. The adjustment will allow the generated CK2 oscillating signal to be in-phase with the input data signal. When CK2=0, the control signal pair have a status of up2=1 and dn2=0. This advances the phase of the CK2 signal. On the other hand, when CK2=1, the control signal will have the status of up2=0 and dn2=1. This results in the push back of the phase of the CK2 signal.

Combination of the four D-type flip-flops 121, 122, 123 and 124 ensures that there is at most one signal active among the generated two pairs of four control signals up1, dn1, up2 and dn2 at any instant. Essentially, when the generated oscillating clock signal CK2 changes state by falling from logical 1 to 0, one of the pair of control signals up1 and dn1 will be active and employed to adjust the phase of the signal CK2 so as to tend to be in-phase with the external input data signal data. On the other hand, when the generated oscillating clock signal CK2 changes state by rising from logical 0 to 1, one of the pair of control signals up2 and dn2 is active and employed to adjust the phase of the signal CK2 so as to tend to be in-phase with the external input data signal data. During the periods when the input data signal data does not alter its phase, all four control signals up1, dn1, up2 and dn2 remain inactive, and no adjustment is applied to the generated oscillating clock signal CK2.

Figure 5:
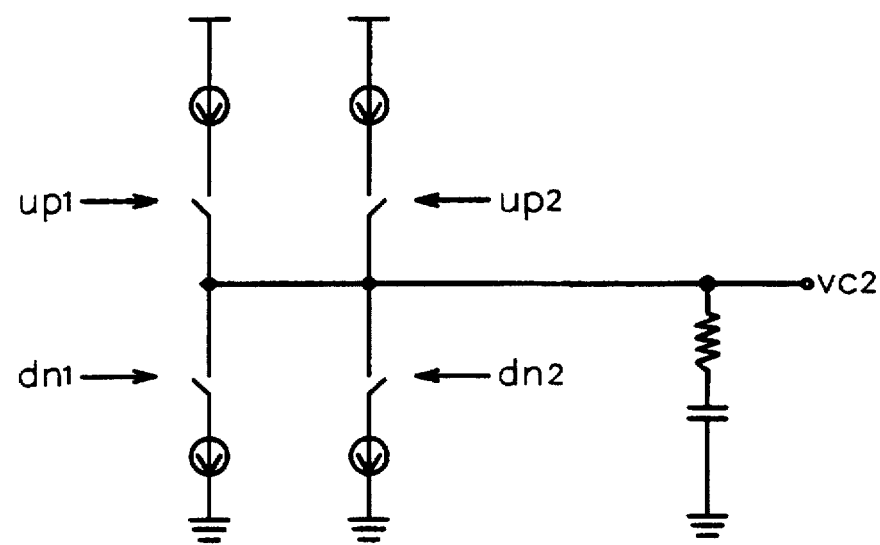
FIG. 5 is a schematic diagram showing a preferred embodiment of the charge pump and loop filter of the slave PLL for the synthesizer in accordance with the present invention.

FIG. 5 is a schematic diagram showing the charge pump and loop filter 22 for the slave PLL S of the clock synthesizer in accordance with the present invention. As is seen in the drawing, the charge pump and loop filter 22 of the slave PLL S includes two pairs of switches up1, dn1 and up2, dn2 controlled respectively by the four control signals up1, dn1, up2 and dn2, which are issued by the phase detector 12. When the phase detector 12 issues its first pair of control signals as up1=1 and dn1=0 and inactivates the second pair as up2=0 and dn2=0, the charge pump and loop filter 22 increases the voltage of its output signal VC2. This can be done by enabling the up1 switch of the charge pump and loop filter 22 and such that the capacitor being charged up. On the other hand, when the first pair of signals received is in the status combination of up1=0 and dn1=1, the charge pump and loop filter 22 decreases the voltage of its output signal VC2 by enabling the dn1 switch and such that the capacitor being discharged. A similar situation can be applied to the second pair of control signals up2 and dn2.

When the two pairs of input signals is presented as up1=0, dn1=0, up2=0 and dn2=0, the voltage at node VC2 is kept unchanged as all the loin- switches of the charge pump and loop filter 22 are kept open-circuited.

Figure 6:
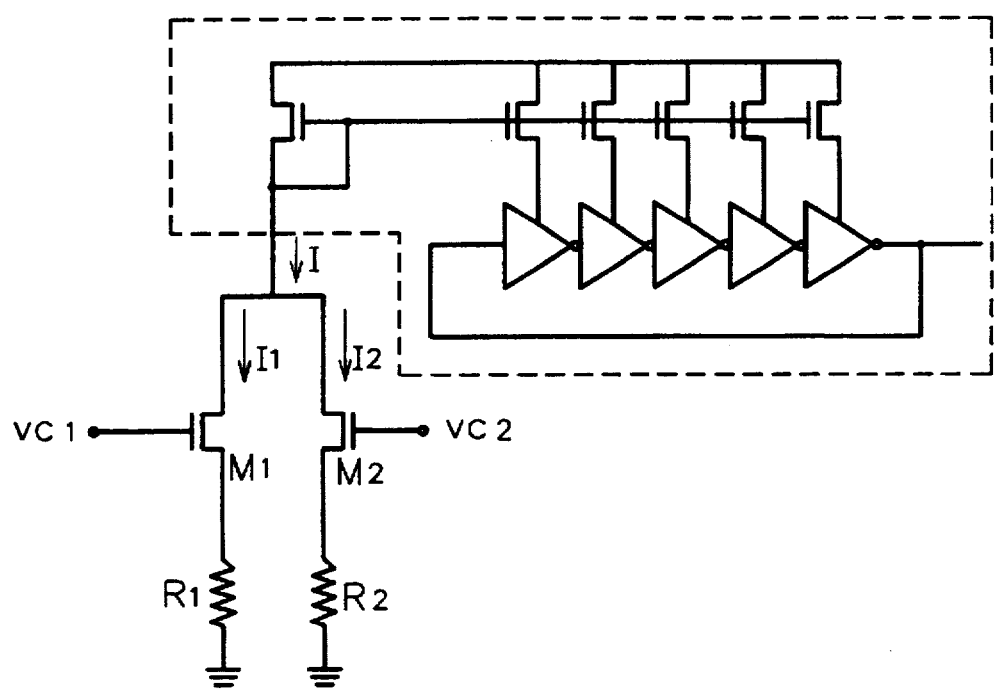
FIG. 6 is a schematic diagram showing a preferred embodiment of the slave VCO of the slave PLL for the synthesizer in accordance with the present invention.

A preferred embodiment of the slave VCO 32 of the slave PLL S is depicted in FIG. 6. The circuit portion identified by the phantom line block in FIG. 6 c is an ring oscillator. When compared with the circuit of FIG. 3 for the master VCO 31, the ring oscillator fetches a current I to two parallel MOS transistor-resistor pairs. The current is spilt between MOS transistors M1 and M2 as current I1 and I2. VC1 signal output by the charge pump and loop filter 21 of the master PLL M is input to gate of the first MOS transistor M1. Transistor M1 has its source connected to system ground potential via a series resistor R1. On the other hand, VC2 signal generated by the charge pump and loop filter 22 of the slave PLL S is input to gate of the second MOS transistor M2. Transistor M2 has its source similarly connected to system ground potential via a series resistor R2. The drains of both MOS transistors M1 and M2 are tied together and connected to the ring oscillator.

VC1 as provided by the master PLL M is intended to serve to provide coarse tuning for the frequency $f2$ of the oscillating output signal CK2 of the slave PLL S. To do this, it is only necessary to maintain the condition $I1 \gg I2$ between the two transistor currents. To obtain this condition, resistor R1 can be chosen to have a resistance far greater than that of R2. Further, the W/L ratio for MOS transistor M1 should also be far greater than that of M2.

Figure 7A:
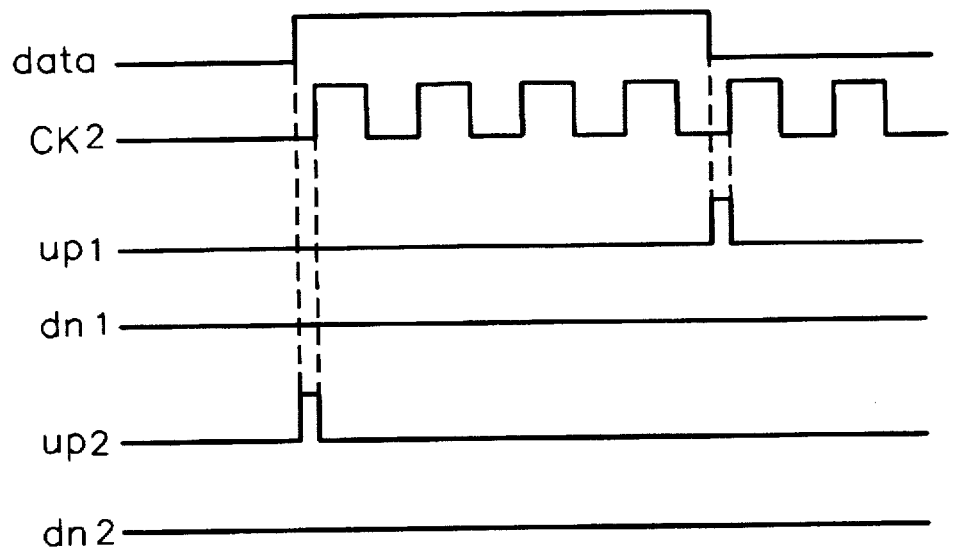
FIG. 7A depicts a timing relationship among the input data signal, the feedback clock signal, and the generated control signals.
Figure 7B:
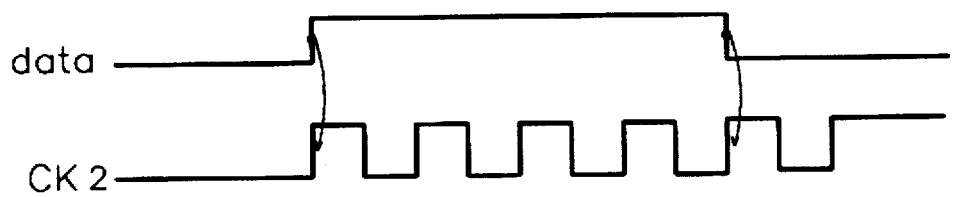
FIG. 7B depicts the situation that the generated clock signal has been adjusted to be synchronized with the input data signal.
Figure 8A:
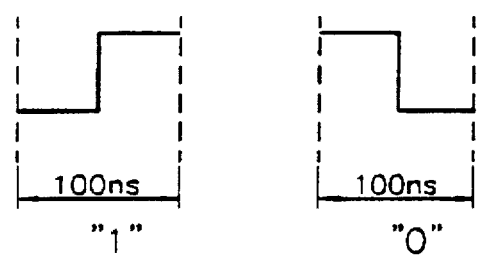
FIG. 8A schematically shows the Manchester encoding for the two basic binary bits.
Figure 8B:
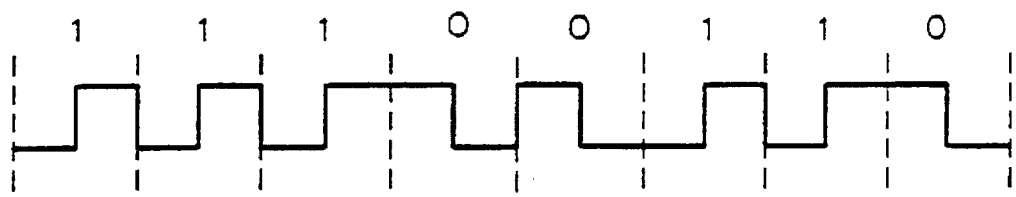
FIG. 8B shows the Manchester code for a given data sequence.
Figure 8C:
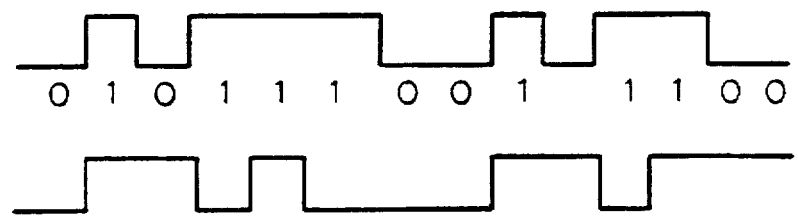
FIG. 8C shows the NRZI code for a given data sequence.
Figure 9:
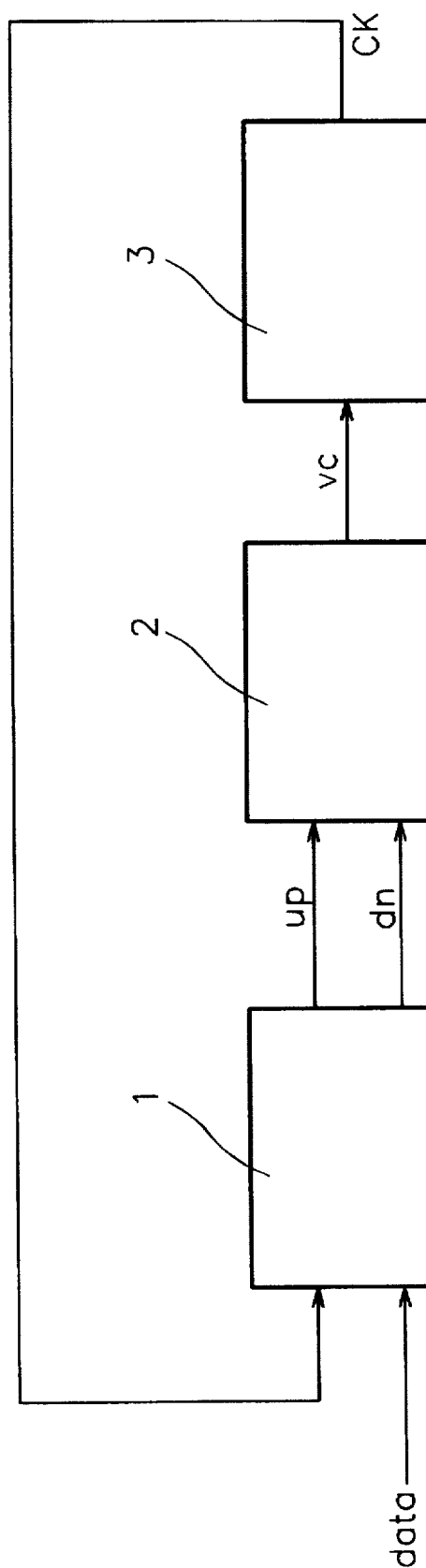
FIG. 9 is a block diagram showing the conventional single-PLL clock synthesizer.
Figure 1:
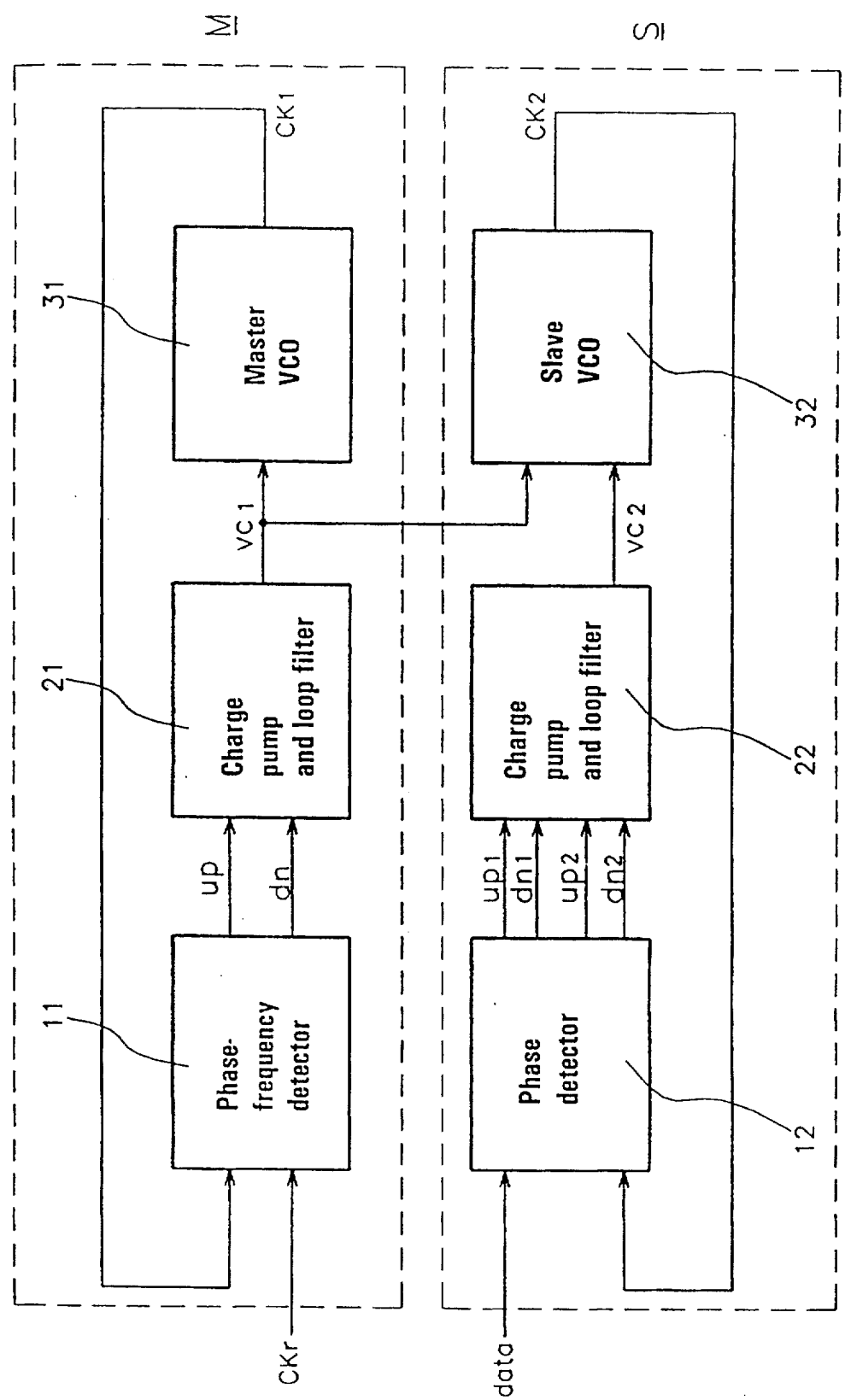

FIG. 7A depicts an example of the outputs of the phase detector 12 of the slave PLL S. Waveforms of these control signal outputs up1, dn1, up2 and dn2 are drawn as a function of the external input data signal data to the slave PLL S, as well as the feedback oscillating signal CK2 of the slave PLL S itself. On the other hand, FIG. 7B depicts a situation wherein the generated clock signal CK2 has been adjusted to be synchronized with the input data signal data under control of these control signals up1, dn1, up2 and dn2.

Thus, the dual PLL clock synthesizer as outlined and described above by way of the preferred embodiments depicted in the accompanying drawings is capable of generating the clock signal synchronized with the received data signals. Such synthesizer is suitable for use in systems receiving any type of data signal streams while preventing data bit errors caused by clock signal jitters. This is an important factor that allows the clock synthesizer to be particularly suitable for application in high-speed Ethernet network environments wherein fast streams of data signals are required to be restored into their original form.

Thus, as persons skilled in this art may well appreciate, the above description of the preferred embodiments of the present invention is intended for the description, not for the limitation to the present invention. Modifications to the outlined embodiments of the present invention may be apparent and should be considered to be within the scope of the present invention that is recited in the claimed section which follows. For example, although rising edge-triggered D-type flip-flops were used to construct the phase detector for the slave PLL, falling edge-triggered counterparts are as well applicable.

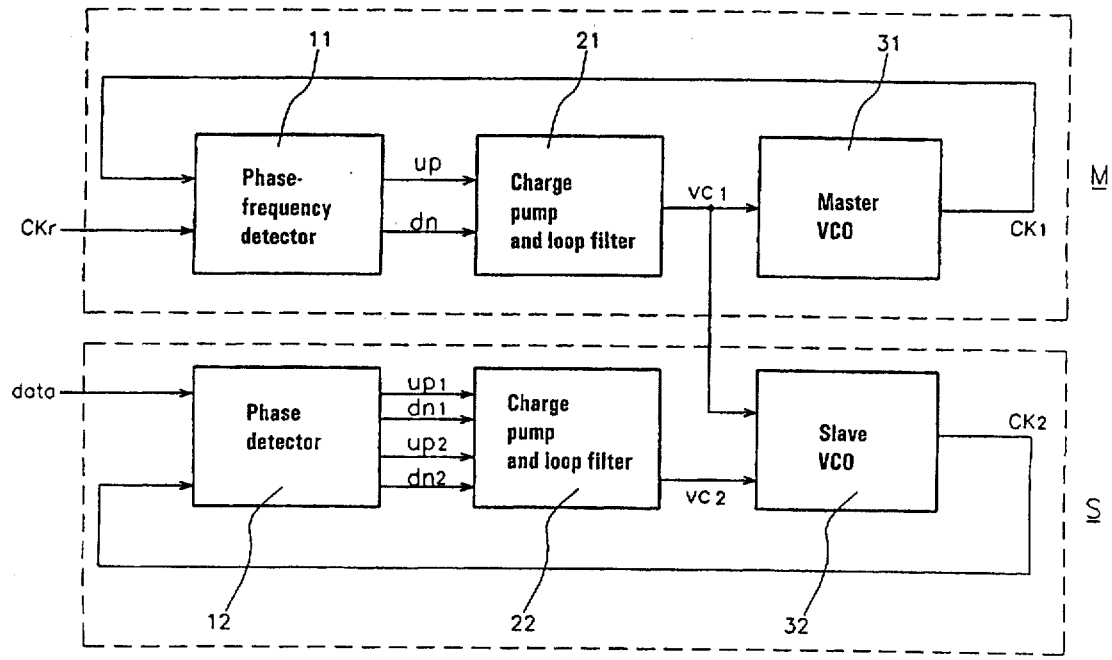

We claim:

1. A dual phase-locked loop clock synthesizer comprising a master phase-locked loop means and a slave phase-locked loop means, said slave phase-locked loop means receiving an encoded data input signal (data) for synchronizing and adjusting in-phase with respect to a reference clock signal (CKr) received by said master phase-locked loop means, wherein said master phase-locked loop means comprises:
    a phase-frequency detector means receiving said reference clock signal (CKr) and a first oscillating signal (CK1) generated and fed back by said master phase-locked loop means for generating a pair of master adjust up (up) and master adjust down (dn) control signals;
    a first charge pump and loop filter means receiving said pair of master adjust up (up) and master adjust down (dn) control signals for generating a corresponding first voltage control signal (VC1); and a master voltage-controlled oscillator means receiving said first voltage control signal (VC1) for generating said first oscillating signal (CK1) having a frequency (f1) proportional (f1=w1×|VC1|) to the voltage of said first voltage control signal (VC1), said generated first oscillating signal (CK1) being fed back to said phase-frequency detector means for adjusting said generated first oscillating signal (CK1) to have the same phase and frequency as that of said reference clock signal (CKr);

said slave phase-locked loop means comprises:

a phase detector means receiving said data input signal (data) and a second oscillating signal (CK2) generated and fed back by said slave phase-locked loop means for generating two pairs of slave adjust up (up1, up2) and slave adjust down (dn1, dn2) control signals;

a second charge pump and loop filter means receiving said two pairs of slave adjust up (up1, up2) and slave adjust down (dn1, dn2) control signals for generating a corresponding second voltage control signal (VC2); and a slave voltage-controlled oscillator means receiving said second voltage control signal (VC2) and said first voltage control signal (VC1) for generating a second oscillating signal (CK2) having a frequency (f2) combinationally proportional (f2=w2×|VC1|+w3×|VC2|, and w2>>w3) to the voltages of said first and second voltage control signals (VC1, VC2), wherein frequency (f2) of said second oscillating signal (CK2) is adjusted to be close to frequency (f1) of said first oscillating signal (CK1) by finely-tuning said second voltage control signal (VC2) utilizing said two pairs of slave adjust up and down (up1, up2 and dn1, dn2) control signals, and said generated second oscillating signal (CK2) being fed back to said phase detector means for adjusting said generated second oscillating signal (CK2) to have the same phase and frequency as that of said data input signal (data) and further have the same phase and frequency as that of said reference clock signal (CKr).

2. The dual phase-locked loop clock synthesizer of claim 1, wherein said phase-frequency detector means is characterized in that when the phase of said reference clock signal (Ckr) leads the phase of said first oscillating signal (CK1), said pair of generated master adjust up (up) and master adjust down (dn) control signals has a status (up=1 and dn=0) advancing the phase of said first oscillating signal (CK1);

when the phase of said reference clock signal (Ckr) lags the phase of said first oscillating signal (CK1), said pair of generated master adjust up (up) and master adjust down (dn) control signals has a status (up=0 and dn=1) delaying the phase of said first oscillating signal (CK1); and when the phase of said reference clock signal (Ckr) substantially equals the phase of said first oscillating signal (CK1), said pair of generated master adjust up (up) and master adjust down (dn) control signals has a status (up=0 and dn=0) maintaining the phase of said first oscillating signal (CK1);

so that said first oscillating signal (CK1) is adjusted to have the same phase and frequency as that of said reference clock signal (Ckr).

3. The dual phase-locked loop clock synthesizer of claim 2, wherein said first charge pump and loop filter means is characterized in that when said pair of generated master adjust up (up) and master adjust down (dn) control signals has a charging status (up=1 and dn=0), said first voltage control signal (VC1) is adjusted to have an increased voltage;

when said pair of generated master adjust up (up) and master adjust down (dn) control signals has a discharging status (up=0 and dn=1), said first voltage control signal (VC1) is adjusted to have a decreased voltage; and when said pair of generated master adjust up (up) and master adjust down (dn) control signals have a unchanged status (up=0 and dn=0), said first voltage control signal (VC1) is maintained to have the unaltered voltage.

4. The dual phase-locked loop clock synthesizer of claim 1, wherein said phase detector means comprises a first, a second, a third and a fourth rising edge-triggered D-type flip-flop wherein said first D-type flip-flop having data input thereof tied to a constant logical 1 or driven by the complement of said oscillator output ($\overline{CK2}$) of said slave phase-locked loop means, reset input thereof connected to said oscillator output (CK2) of said slave phase-locked loop means, and clock input thereof driven by the complement of said data input signal ($\overline{data}$) for generating first of said two slave adjust up (up1) control signals;

said second D-type flip-flop having data input thereof tied to a constant logical 1 or driven by said oscillator output (CK2) of said slave phase-locked loop means, reset input thereof connected to the complement of said oscillator output ($\overline{CK2}$) of said slave phase-locked loop means, and clock input thereof driven by the complement of said data input signal ($\overline{data}$) for generating first of said two slave adjust down (dn1) control signals;

said third D-type flip-flop having data input thereof tied to a constant logical 1 or driven by the complement of said oscillator output ($\overline{CK2}$) of said slave phase-locked loop means, reset input thereof connected to said oscillator output (CK2) of said slave phase-locked loop means, and clock input thereof driven by said data input signal (data) for generating second of said two slave adjust up (up2) control signals;

said fourth D-type flip-flop having data input thereof tied to a constant logical 1 or driven by said oscillator output (CK2) of said slave phase-locked loop means, reset input thereof connected to the complement of said oscillator output ($\overline{CK2}$) of said slave phase-locked loop means, and clock input thereof driven by said data input signal (data) for generating second of said two slave adjust down (dn2) control signals; wherein said first of said two slave adjust up (up1) control signals and said first of said two slave adjust down (dn1) control signals adjusting phase of said oscillator output (CK2) of said slave phase-locked loop means to be in-phase with said data input signal (data) when said data input signal (data) changes state from logical 1 to 0; said second of said two slave adjust up (up2) control signals and said second of said two slave adjust down (dn2) control signals adjusting phase of said oscillator output (CK2) of said slave phase-locked loop means to be in-phase with said data input signal (data) when said data input signal (data) changes state from logical 0 to 1;

and wherein there is at most one of said two slave adjust up (up1, up2) control signals and said two slave adjust down (dn1, dn2) control signals active at any instant.

5. The dual phase-locked loop clock synthesizer of claim 4, wherein said second charge pump and loop filter means is characterized in that when said pair of generated slave adjust up (up1, up2) has a charging status (up1=1 or up2=1), said second voltage control signal (VC2) is adjusted to have an increased voltage;

when said pair of generated slave adjust down (dn1, dn2) has a discharging status (dn1=1 or dn2=1), said second voltage control signal (VC2) is adjusted to have a decreased voltage; and when said pair of generated slave adjust up (up1, up2) and slave adjust down (dn1, dn2) control signals have a unchanged status (up1=0, up2=0, dn1=0 and dn2=0), said second voltage control signal (VC2) is maintained to have the unaltered voltage.

6. The dual phase-locked loop clock synthesizer of claim 1, wherein said slave voltage-controlled oscillator means comprising a first and a second MOS transistor (M1, M2) and a ring oscillator is characterized in that said first voltage control signal (VC1) being input to gate of said first MOS transistor (M1) and said second voltage control signal (VC2) being input to gate of said second MOS transistor (M2), drains of said first and second MOS transistors (M1, M2) being tied together at a node and connected to said ring oscillator, source of said first MOS transistor (M1) being connected to a first resistor (R1) and then to ground potential, source of said second MOS transistor (M2) being connected to a second resistor (R2) and then to ground potential, wherein the resistance of said first resistor (R1) is far greater than the resistance of said second resistor (R2), and the width/length ratio of said first MOS transistor (M1) is far greater than that of said second MOS transistor (M2), such that said first voltage control signal (VC1) generally determines said frequency (f2) of said second oscillating signal (CK2), and said second voltage control signal (VC2) fine-tunes said frequency (f2) of said second oscillating signal (CK2).

* * * * *

UNITED STATES PATENT AND TRADEMARK OFFICE
CERTIFICATE OF CORRECTION

PATENT NO. : 5,734,301
DATED : March 31, 1998
INVENTOR(S) : Chao-Cheng Lee, et al.

It is certified that error appears in the above-identified patent and that said Letters Patent is hereby corrected as shown below:

The title page, showing the illustrative figure should be deleted to be replaced with the attached title page.

Drawing sheet, consisting of Fig. 1, should be deleted to be replaced with the Drawing Sheet, consisting of Fig. 1, as shown on the attached page.

Signed and Sealed this

Twentieth Day of July, 1999

Q. TODD DICKINSON

*Attest:*

*Attesting Officer*              *Acting Commissioner of Patents and Trademarks*

United States Patent [19]

Lee et al.

[11] Patent Number: 5,734,301
[45] Date of Patent: Mar. 31, 1998

[54] DUAL PHASE-LOCKED LOOP CLOCK SYNTHESIZER

[75] Inventors: Chao-Cheng Lee, Chungli; Chen-Chih Huang, Hsinchu Hsien, both of Taiwan

[73] Assignee: Realtek Semiconductor Corporation, Taipei, Taiwan

[21] Appl. No.: 698,308

[22] Filed: Aug. 15, 1996

[51] Int. Cl.$^6$ .................................. H03L 7/07; H03L 7/089
[52] U.S. Cl. ........................ 331/2; 331/1 A; 331/17; 331/25; 331/34; 327/148; 327/150; 375/374; 375/376
[58] Field of Search ........................ 331/1 A, 2, 8, 331/17, 25, 34, 57; 327/147–150, 156–159; 360/41, 51; 375/374–376

[56] References Cited

U.S. PATENT DOCUMENTS 5,546,052  8/1996  Austin et al. ..................... 331/25 X

OTHER PUBLICATIONS

"A 200 MHz CMOS Phase–Locked Loop with Dual Phase Detectors", *IEEE Journal of Solid–State Circuits*, vol. 24, No. 6, Dec. 1989, Ware K.M. et al, pp. 1560–1568.

*Primary Examiner*—David Mis
*Attorney, Agent, or Firm*—Michael D. Bednarek; Kilpatrick Stockton LLP

[57] ABSTRACT

A dual phase-locked loop (PLL) clock synthesizer is disclosed for generating clock signal in synchronization with the data input signal received over a network environment. The dual PLL clock synthesizer is suitable for processing data streams of any bit sequence without data error caused by interference due to clock signal jittering phenomena. The dual PLL clock synthesizer is particularly suitable for application to high-speed Ethernet network environment such as for decoding to obtain the original data conveyed over the network through selected encoding scheme.

6 Claims, 7 Drawing Sheets